(12) United States Patent
Park

(10) Patent No.: US 7,298,082 B2
(45) Date of Patent: Nov. 20, 2007

(54) ORGANIC ELECTROLUMINESCENT DISPLAY DEVICE WITH PROJECTING STRUCTURE LAYER

(75) Inventor: Jin-Woo Park, Yongin-si (KR)

(73) Assignee: Samsung SDI Co., Ltd., Suwon (KR)

( * ) Notice: Subject to any disclaimer, the term of this patent is extended or adjusted under 35 U.S.C. 154(b) by 400 days.

(21) Appl. No.: 10/959,975

(22) Filed: Oct. 8, 2004

(65) Prior Publication Data

US 2005/0077819 A1 Apr. 14, 2005

(30) Foreign Application Priority Data

Oct. 9, 2003 (KR) ............. 10-2003-0070337

(51) Int. Cl.
*H01J 1/62* (2006.01)
*H01J 63/04* (2006.01)

(52) U.S. Cl. .............. 313/504; 313/498; 313/506
(58) Field of Classification Search ........... 313/504, 313/498, 506, 512, 292
See application file for complete search history.

(56) References Cited

U.S. PATENT DOCUMENTS

| 6,489,638 | B2* | 12/2002 | Seo et al. ............. 257/98 |
| 7,128,632 | B2* | 10/2006 | Nakamura ............. 445/25 |
| 2001/0026125 | A1* | 10/2001 | Yamazaki et al. ....... 313/505 |
| 2001/0035713 | A1* | 11/2001 | Kimura ................. 313/501 |
| 2003/0048072 | A1* | 3/2003 | Ishihara et al. ......... 313/506 |
| 2003/0127974 | A1* | 7/2003 | Miyazawa ............... 313/504 |
| 2005/0040762 | A1* | 2/2005 | Kurihara ................ 313/512 |

FOREIGN PATENT DOCUMENTS

KR 10-2002-055411 7/2002

* cited by examiner

*Primary Examiner*—Nimeshkumar D. Patel
*Assistant Examiner*—Kevin Quarterman
(74) *Attorney, Agent, or Firm*—H.C. Park & Associates, PLC

(57) ABSTRACT

The present invention relates to an organic electroluminescent display device in which luminance and emission efficiency may be improved by forming light emitting elements of the organic electroluminescent display device in a projecting structure and provides an organic electroluminescent display device comprising a projecting structure layer formed on an insulating substrate; first electrode formed in a projecting structure on the substrate including the projecting structure layer; an organic layer formed on the first electrode; and second electrode formed on the insulating substrate, wherein the second electrode may be formed in a projected shape by the projecting structure layer so that the second electrode surrounds the organic layer.

10 Claims, 2 Drawing Sheets

ORGANIC ELECTROLUMINESCENT DISPLAY DEVICE WITH PROJECTING STRUCTURE LAYER

CROSS REFERENCE

This application claims the benefit of Korean Patent Application No. 2003-70337, filed on Oct. 9, 2003, the disclosure of which is hereby incorporated herein by reference in its entirety.

BACKGROUND OF THE INVENTION

1. Field of the Invention

The present invention relates to an organic electroluminescent display device (and method for fabricating the same), and more particularly to a rear emitting type organic electroluminescent display device having improved luminance and emission efficiency. These advantages may be obtained by forming light emitting elements in a projecting structure in such a way that a second electrode surrounds an organic layer.

2. Description of Related Art

Organic electroluminescent display devices have received recent attention because of their merits with regard to thinness, width of viewing angle, weight, size, response speed and power consumption in comparison to cathode ray tube (CRT) and liquid crystal display (LCD) devices. Particularly, organic electroluminescent display devices may have the advantage of being easily fabricated through a simple fabrication process. The simplified fabrication process may arise from the simple structure of an organic electroluminescent display device: anode electrode, organic material film, and cathode electrode.

A brief description of a rear emitting type organic electroluminescent display follows with reference to FIG. 1.

FIG. 1 is a cross sectional view for showing a conventional rear emitting type organic electroluminescent display device.

As shown in FIG. 1, first electrode 150 may be electrically connected to the thin film transistor and may function as an anode electrode. First electrode 150 may be formed on a lower insulating substrate 100 equipped an inter-insulating layer 140 on the thin film transistor T including activation layer 110, gate electrode 120, and source/drain electrodes 131 and 135.

An opening part 165 for exposing a part of first electrode 150 may be formed by creating a pixel defined layer 160 on the front side of the lower insulating substrate 100 and using a photolithography technique on pixel defined layer 160 after forming first electrode 150.

An organic layer 170 may be formed on an upper part of an opening part 165 after forming opening part 165. Open part 165 may expose a part of first electrode 150.

An organic emitting device E including first electrode 150, organic layer 170, and a second electrode 180 may be formed by creating second electrode 180 on the front side of the lower insulating substrate 100 after forming the organic layer 170. Second electrode 180 may function as a cathode electrode.

The lower insulating substrate 100 including the thin film transistor T and organic emitting device E may be sealed using a sealing substrate as an upper insulating substrate. The sealing substrate has been omitted from the drawings, but may be formed after forming the organic emitting device E.

Unfortunately, only about 20% of light actually generated from the organic layer 170 may be extracted to the outside since the light may be lost by being absorbed by several films of a lower part of the organic layer 170 in the process of being emitted from the organic layer 170. A particularly large amount of light may be lost at one side from the first electrode 150 functioning as an anode electrode. The loss may be through total reflection. For example, a conventional rear emitting type organic electroluminescent display device may have problems with low emission efficiency and luminance because a large amount of light emitted from the organic layer 170 may be lost.

SUMMARY OF THE INVENTION

Therefore, in order to solve the foregoing problems of the conventional art, it may be one aspect of the present invention to provide a rear emitting type organic electroluminescent display device in which emission efficiency and luminance may be improved by forming an organic emitting device in a projecting structure, thereby reflecting light getting out to the side by total reflection at each interlayer boundary surface so that the reflected light may be extracted in a rear direction.

In order to achieve the foregoing object, the present invention provides an organic electroluminescent display device comprising a projecting structure layer formed on an insulating substrate; first electrode formed in a projecting structure on the substrate including the projecting structure layer; an organic layer formed on the first electrode; and second electrode formed on the insulating substrate, wherein the second electrode formed in a projected shape by the projecting structure layer so that the second electrode surrounds the organic layer.

In embodiments of the present invention, a part of the second electrode may be positioned under the lower surface of flat region of the first electrode. Furthermore, it may be desirable that the projecting structure layer formed of a material having a small refractive index difference between the projecting structure layer and the first electrode, and it more that the projecting structure layer formed of a material having a refractive index of 1.0 to 1.7.

Furthermore, it may be desirable that the projecting structure layer formed of any one material selected from the group consisting of an organic material of BCB, acryl based curing resin, phenol based curing resin or polyimide, an inorganic material of silicon oxide or silicon nitride, and an organic and inorganic composite material ormocer, aerosol or porous silicon dioxide.

Furthermore, it may be desirable that the projecting structure layer has a thickness of 300 nm to 10 μm and a gradient of 15 degrees to 70 degrees. Furthermore, it may be desirable that the organic layer formed on an upper part of the first electrode a part of which exposed by a pixel defined layer and the pixel defined layer thinner than the projecting structure layer.

BRIEF DESCRIPTION OF THE DRAWINGS

The above and other features and advantages of the present invention will become more apparent to those of ordinary skill in the art by describing in detail several embodiments thereof with reference to the attached drawings in which.

DETAILED DESCRIPTION OF THE INVENTION

Figure 1:
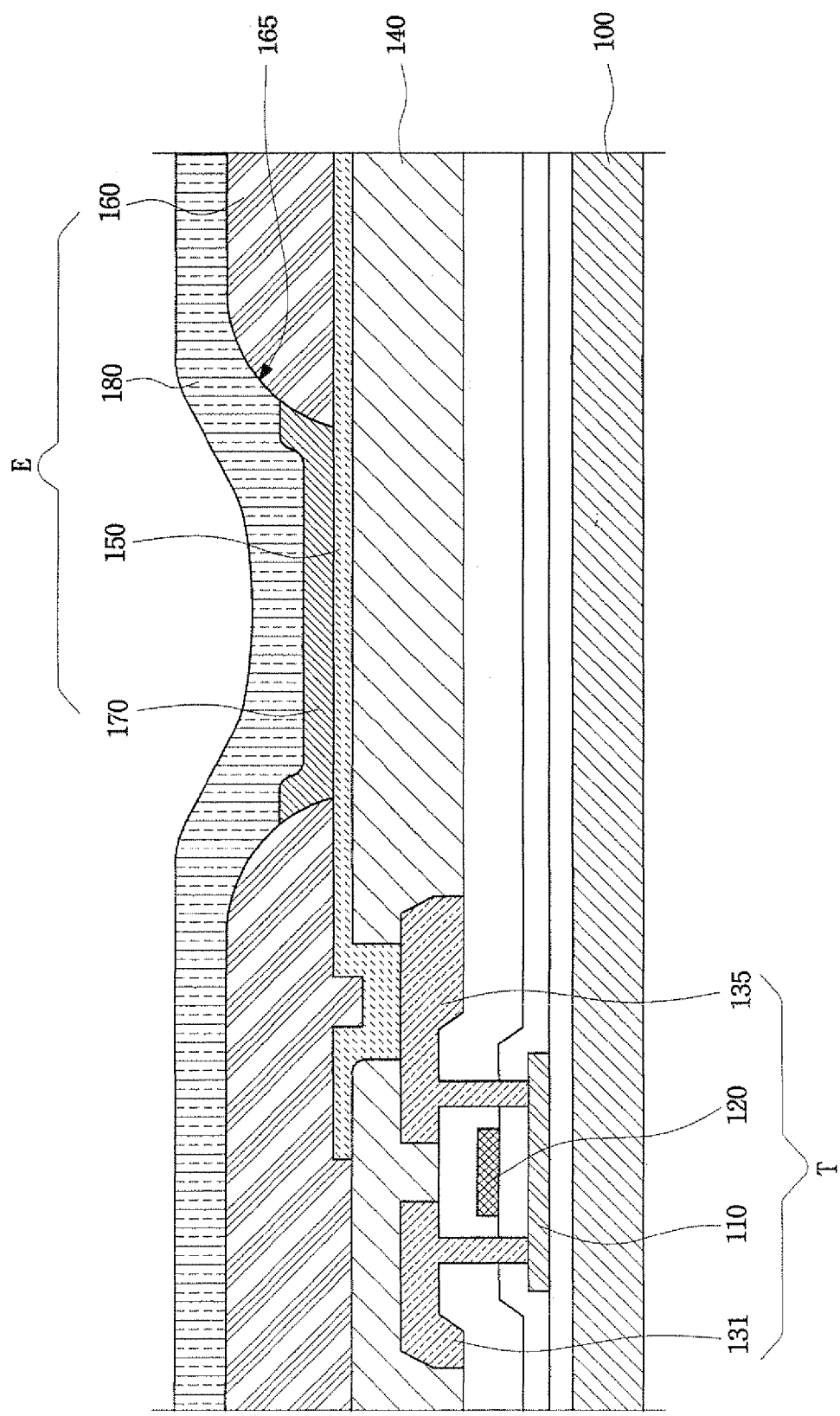
FIG. 1 is a cross sectional view for showing an organic electroluminescent display device.

The present invention will now be described in detail in connection with several embodiments with reference to the accompanying drawings. For reference, like reference characters designate corresponding parts throughout several views.

Figure 2:
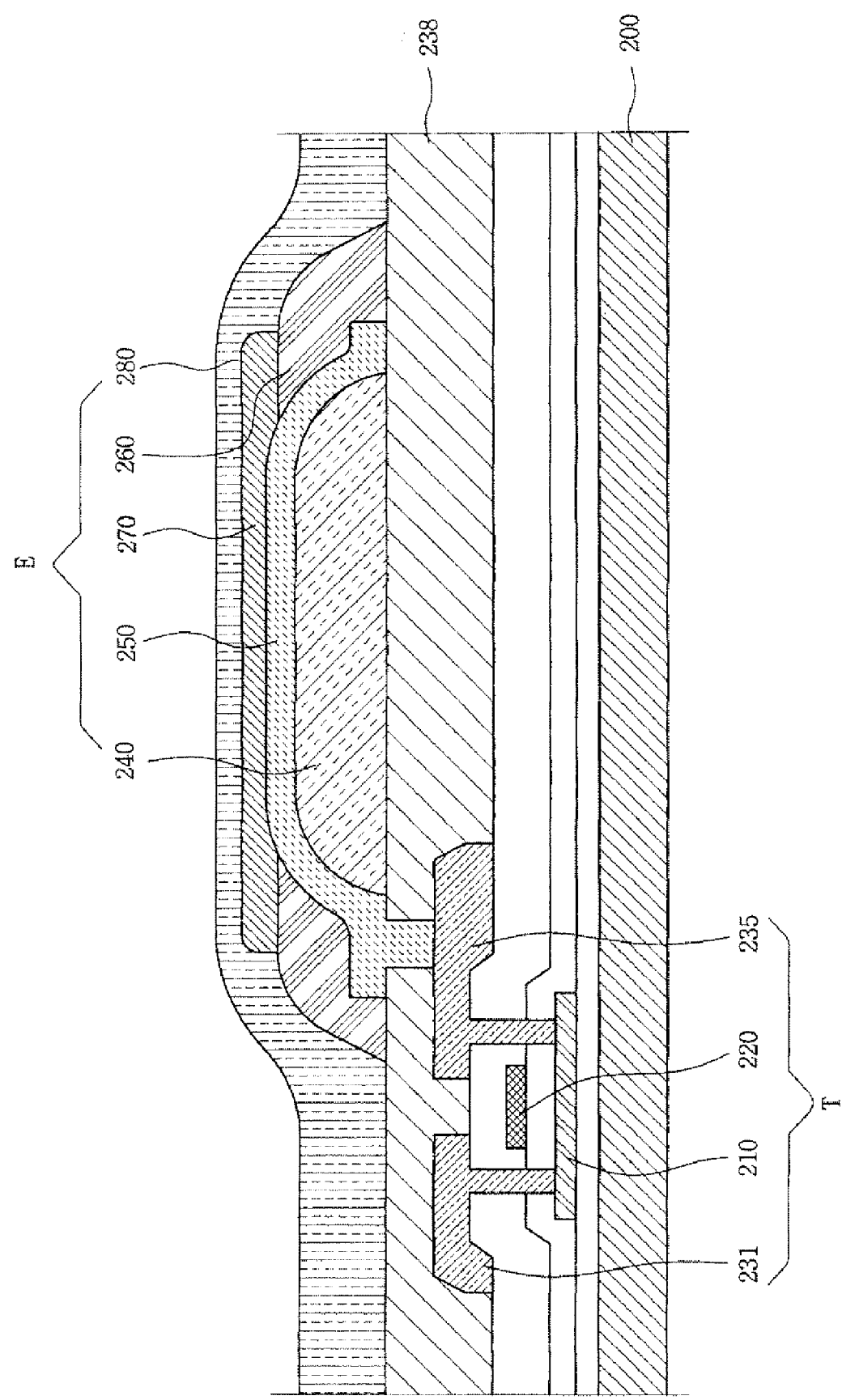
FIG. 2 is a cross sectional view for showing an organic electroluminescent display device according to an embodiment of the present invention.

FIG. 2 is a cross sectional view showing a rear emitting type organic electroluminescent display device according to an embodiment of the present invention.

An organic electroluminescent display device according to an embodiment of the present invention as illustrated in FIG. 2 includes a projecting structure layer 240 formed on an inter-insulating layer 238 on an insulating substrate 200; first electrode 250 formed on the insulating substrate 200 including the projecting structure layer 240; an organic layer 270 formed in a projecting structure on the first electrode 250; and second electrode 280 formed on the front side of the insulating substrate 200, wherein the second electrode 280 may be formed in a projected shape by the projecting structure layer 240 so that the second electrode 280 surrounds the organic layer 270. Such a projecting structure 240 formed in a projecting shape may serve as an elevating structure.

A part of the second electrode 280 may be positioned under the lower surface of flat region of the first electrode 250 by the projecting structure layer 240 so that light emitted from the organic layer 270 may be reflected to the rear side, and the reflected light may be extracted to the rear side by reflecting light getting out to the side by total reflection without transmission of the first electrode 250 and projecting structure layer 240.

As shown in FIG. 2, a projecting structure layer 240 may be formed by depositing an organic material having low refractive index on a lower insulating substrate 200 equipped with a thin film transistor T including activation layer 210, gate electrode 220 and source/drain electrodes 231, 235 and patterning the organic material. The projecting structure layer 240 plays a role of forming an organic emitting device E in a projected structure for the front direction. The lower insulating substrate 200 together with thin film transistor T, and including its various layers below first electrode 250, may be an example of the control portion of the device.

It may be desirable that the projecting structure layer 240 may be formed in such a way that the projecting structure layer may have a thickness of 300 nm to 10 μm, and the side of the projecting structure layer 240 may have a gradient of 15 degrees to 70 degrees. Such a projecting structure 240 may result in a convex shape being supplied to layers deposited or otherwise formed on projecting structure 240.

Furthermore, the projecting structure layer 240 may be preferably formed of a material having a small refractive index difference between the projecting structure layer and first electrode to be formed afterward, and more preferably formed of a material having a refractive index of 1.0 to 1.7 so that total reflection generated at the boundary surface between the first electrode and the projecting structure layer 240 may be minimized.

Furthermore, it may be desirable that the projecting structure layer 240 may be formed of an organic material such as BCB, acryl based curing resin, phenol based curing resin and polyimide, an inorganic material such as silicon oxide and silicon nitride, or an organic and inorganic composite material such as ormocer, aerosol and porous silica.

First electrode 250 operated as an anode electrode, electrically connected to the thin film transistor T and formed in a projected structure by the projecting structure layer may be formed by depositing a transparent conductive material formed of ITO and IZO on the projecting structure layer 240 and patterning the transparent conductive material after forming the projecting structure layer 240.

A part of the first electrode 250 may be exposed by forming a pixel defined layer 260 on the front side of the lower insulating substrate 200 and photolithographing the pixel defined layer 260 after forming the first electrode 250, wherein the pixel defined layer 260 may be preferably formed in such a way that the pixel defined layer 260 may be thinner than the projecting structure layer 240.

An organic layer 270 may be formed on an exposed part of the first electrode 250 after forming the pixel defined layer 260. The organic layer 270 can be formed of several layers according to function of the organic layer 270 and may be generally formed in a multilayer structure including at least one or more layers selected from hole injection layer (HIL), hole transfer layer (HTL), emitting layer, hole blocking layer (HBL), electron transport layer (ETL) and electron injection layer (EIL). The organic layer 270 and accompanying layers such as the pixel defined layer 260 and the second electrode 280 may be an example of the electroluminescent portion of the device.

An organic emitting device E having projecting structure layer 240, first electrode 250, pixel defined layer 260, organic layer 270, and second electrode 280 formed in a projected structure for the front side may be formed by forming second electrode 280, operated as a cathode electrode and formed in a projected structure on the front side of the lower insulating substrate 200, after forming the organic layer 270, wherein the second electrode 280 may be formed in a projected structure by the projecting structure layer 240.

Furthermore, a material of Mg, Ag, Ca, Al or Ba having superior reflectivity and lower work function than a material used as the first electrode 250 may be preferably used as the second electrode 280.

Furthermore, it may be desirable that a part of the second electrode 280 may be positioned under the lower surface of flat region of the first electrode 250 so that the second electrode 280 surrounds the organic layer 270 to extract the reflected light to the rear side by reflecting light getting out to the side by total reflection without transmission of the first electrode 250 and projecting structure layer 240.

A lower insulating substrate 200 including light emitting element E and thin film transistor T may be sealed using a sealing substrate used as an upper insulating substrate although the sealing substrate is not illustrated on drawings.

If voltage is impressed to an organic electroluminescent display device formed through the foregoing processes, holes injected through anode electrode may be combined with electrons injected through cathode electrode in organic layer so that the organic layer may be emitted, and light emitted from the organic layer 270 comes out in a direction of the first electrode 250, wherein light loss may be increased accordingly since total reflection may be increased if a refractive index difference between the first electrode 250 and lower film may be large.

The total reflection may be generated at the boundary surface between the dense medium and the sparse medium if a refractive index between the dense medium and the sparse medium may be large if light proceeds from dense medium to sparse medium.

The total reflection may be generated if an incidence angle of light may be larger than an incidence angle at which total reflection may be generated, and critical angle of the total reflection may be $\sin\theta = 1/n_{1,2} = n_1/n_2$, wherein $n_{1,2}$ may be a refractive index of the dense medium to the sparse medium, $n_1$ may be a refractive index of the sparse medium, and $n_2$ may be a refractive index of the dense medium.

For example, the total reflection may be further increased since the larger a refractive index difference between the sparse medium and the dense medium may be, the smaller the critical angle of the total reflection becomes.

Therefore, an organic electroluminescent display device including a projecting structure type organic emitting device E according to an embodiment of the present invention reduces total reflection by forming the first electrode 250 and projecting structure layer 240 using a material having the similar refractive index and theoretically increases 100% or more of light extracting ratio by reflecting light lost to the side by the total reflection at the second electrode 280.

As described in the above, the present invention may be capable of providing an organic electroluminescent display device with superior luminance and emission efficiency by forming light emitting element of the organic electroluminescent display device in a projected structure, thereby collecting light emitted from organic layer at reflective second electrode and reflecting light getting out to the side by total reflection at first electrode so that the reflected light may be collected.

Furthermore, the present invention may be capable of providing an organic electroluminescent display device whose power consumption and life time may be improved by improving luminance and emission efficiency.

While the invention has been particularly shown and described with reference to several embodiments thereof, it will be understood by those skilled in the art that the foregoing and other changes in form and details may be made therein without departing from the spirit and scope of the invention.

What is claimed is:

1. An organic electroluminescent display device, comprising:
    a projecting structure layer formed on an insulating substrate;
    a first electrode disposed on the projecting structure layer such that the first electrode has a projected shape in a perpendicular direction to the insulating substrate;
    an organic layer formed on the first electrode; and
    a second electrode formed on the insulating substrate,
    wherein the second electrode is formed in a projected shape by the projecting structure layer so that the second electrode surrounds the organic layer.

2. The organic electroluminescent display device according to claim 1,
    wherein a part of the second electrode is positioned under the lower surface of a flat region of the first electrode.

3. The organic electroluminescent display device according to claim 1,
    wherein the projecting structure layer is formed of a material having substantially the same refractive index as that of the first electrode.

4. The organic electroluminescent display device according to claim 3,
    wherein the projecting structure layer is formed of a material having a refractive index of 1.0 to 1.7.

5. The organic electroluminescent display device according to claim 1,
    wherein the projecting structure layer is formed of an organic material selected from the group consisting of BOB, acryl based curing resin, phenol based curing resin and polyimide.

6. The organic electroluminescent display device according to claim 1,
    wherein the projecting structure layer is formed of silicon oxide or silicon nitride.

7. The organic electroluminescent display device according to claim 1,
    wherein the projecting structure layer is formed of an organic and inorganic composite material of ormocer, aerosol or porous silicon dioxide.

8. The organic electroluminescent display device according to claim 1,
    wherein the projecting structure layer has a thickness of 300 nm to 10 μm.

9. The organic electroluminescent display device according to claim 1,
    wherein the projecting structure layer has a gradient of 15 degrees to 70 degrees.

10. The organic electroluminescent display device according to claim 1, wherein the organic layer is formed on an upper part of the first electrode a part of which is exposed by a pixel defined layer, and the pixel defined layer is thinner than the projecting structure layer.

* * * * *